(12) United States Patent
Chu et al.

(10) Patent No.: US 9,275,880 B2
(45) Date of Patent: Mar. 1, 2016

(54) LIQUID REPLENISHING DEVICE

(71) Applicant: Beijing Sevenstar Electronics Co., Ltd., Beijing (CN)

(72) Inventors: Guochao Chu, Beijing (CN); Jinqun He, Beijing (CN); Yingying Wang, Beijing (CN); Likun Pei, Beijing (CN)

(73) Assignee: BEIJING SEVENSTAR ELECTRONICS CO., LTD., Beijing (CN)

( * ) Notice: Subject to any disclaimer, the term of this patent is extended or adjusted under 35 U.S.C. 154(b) by 131 days.

(21) Appl. No.: 14/127,970

(22) PCT Filed: Mar. 27, 2013

(86) PCT No.: PCT/CN2013/073236
§ 371 (c)(1),
(2) Date: Dec. 20, 2013

(87) PCT Pub. No.: WO2014/056305
PCT Pub. Date: Apr. 17, 2014

(65) Prior Publication Data
US 2014/0305515 A1 Oct. 16, 2014

(30) Foreign Application Priority Data
Oct. 12, 2012 (CN) .......................... 2012 1 0387839

(51) Int. Cl.
*H01L 21/67* (2006.01)
*H01L 21/02* (2006.01)
*B08B 3/14* (2006.01)

(52) U.S. Cl.
CPC ............ *H01L 21/67017* (2013.01); *B08B 3/14* (2013.01); *H01L 21/02041* (2013.01); *Y10T 137/4673* (2015.04); *Y10T 137/6416* (2015.04); *Y10T 137/85954* (2015.04)

(58) Field of Classification Search
CPC ................... H01L 21/67017; H01L 21/02041; B08B 3/14; B01J 19/0006; B01J 2219/00186; G05D 21/02; G05D 11/138
USPC ........................................................ 137/255
See application file for complete search history.

(56) References Cited

U.S. PATENT DOCUMENTS

| | | | |
|---|---|---|---|
| 5,519,638 A * | 5/1996 | Tiao ............................... 700/281 |
| 5,992,437 A * | 11/1999 | Takasaki et al. .................... 137/3 |
| 6,146,008 A * | 11/2000 | Laederich et al. ............. 366/136 |
| 7,438,819 B2 * | 10/2008 | Hayashi .................... 210/748.11 |
| 2004/0154651 A1 * | 8/2004 | Mokuo ......................... 134/94.1 |
| 2014/0261824 A1 * | 9/2014 | Byers et al. .................... 137/896 |

* cited by examiner

*Primary Examiner* — Kevin Lee

(57) ABSTRACT

The present invention provides a liquid replenishing device comprising a liquid storage tank, a chemical liquid supply pipeline, an ultrapure water supply pipeline, an ultrapure water quantitative supplement pipeline and a circulating pipeline. The chemical liquid supply pipeline supplies chemical liquids to the liquid storage tank. The ultrapure water supply pipeline supplies ultrapure water to the liquid storage tank. The ultrapure water quantitative supplement pipeline quantitatively replenishes ultrapure water to the liquid storage tank. One end of the circulating pipeline is connected with the outlet of the liquid storage tank, the other end of the circulating pipeline is connected with the inlet of the liquid storage tank.

7 Claims, 1 Drawing Sheet

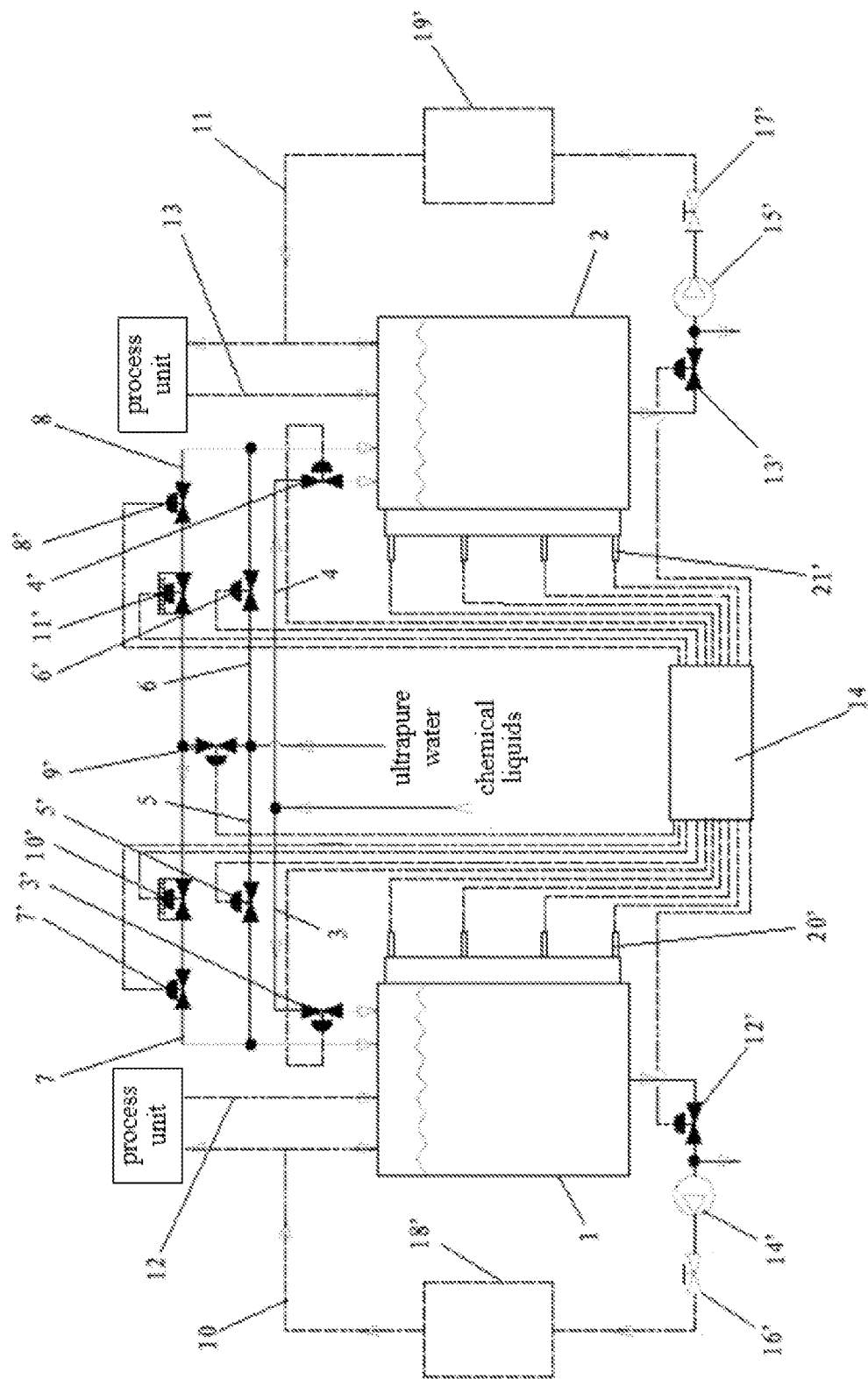

LIQUID REPLENISHING DEVICE

CROSS-REFERENCE TO RELATED APPLICATION

This application claims the priority benefit of International Patent Application Serial No. PCT/CN2013/073,236, filed Mar. 27, 2013, which is related to and claims the priority benefit of China patent application serial no. 201210387839.6 filed Oct. 12, 2012. The entirety of each of the above-mentioned patent applications is hereby incorporated by reference herein and made a part of this specification.

FIELD OF THE INVENTION

The present invention relates to the field of semiconductor cleaning technology, more particularly to a liquid replenishing device.

BACKGROUND OF THE INVENTION

In the semiconductor fabrication, cleaning processes are required in pluralities of manufacturing steps to clean the silicon wafer. During the cleaning processes, various kinds of chemical liquids with different concentration and composition proportions are used. When the chemical liquids are mixed or used for a period of time, the original concentration will change, thus a certain amount of chemical liquids or ultrapure water are required to be replenished accordingly. Generally, the chemical liquids are stored in a chemical container, such as a tank or reservoir. At first, some chemical liquids with concentration satisfying the cleaning demand are fed into the container. These chemical liquids are reused during the cleaning processes which leads to the change of the chemical liquids concentration, and then additional chemical liquids or ultrapure water are required to be supplied. Consequently, there exists a need of replenishing chemical liquids or ultrapure water into the container periodically and quantitatively. Currently, the supplement of the chemical liquids or the ultrapure water are mostly determined by an electrically controlled metering pump utilizing signal control or signal feedback to achieve accurate supplement. However, such electrically controlled metering pump is quite large in size with complicated control system and structures, which increases the cost.

SUMMARY OF THE INVENTION

Accordingly, at least one objective of the present invention is to provide a liquid replenishing device to achieve accurate supplement of the liquid volume, so as to distribute appropriate quantitative liquid to the related processing unit at a predetermined time.

To achieve these and other advantages and in accordance with the objective of the invention, as embodied and broadly described herein. The invention provides a liquid replenishing device comprising a liquid storage tank, a chemical liquid supply pipeline supplying chemical liquids to the liquid storage tank, an ultrapure water supply pipeline supplying ultrapure water to the liquid storage tank, an ultrapure water quantitative supplement pipeline quantitatively replenishing ultrapure water to the liquid storage tank, and a circulating pipeline; one end of the circulating pipeline is connected with the outlet of the liquid storage tank, the other end of the circulating pipeline is connected with the inlet of the liquid storage tank.

In the device mentioned above, the chemical liquid supply pipeline is provided with a chemical liquid supply pneumatic valve.

In the device mentioned above, the ultrapure water supply pipeline is provided with an ultrapure water supply pneumatic valve.

In the device mentioned above, the ultrapure water quantitative supplement pipeline is provided with an ultrapure water replenishing pneumatic valve, a main replenishing pneumatic valve and a metering pump. The metering pump flow is determined by the required volume of the ultrapure water to be replenished.

In the device mentioned above, the circulating pipeline is sequentially provided with a pneumatic valve for transferring the chemical liquid from the liquid storage tank to the corresponding process unit, a liquid transfer pump, a manual valve and a heating filter for heating and filtering the chemical liquid from the liquid storage tank.

In the device mentioned above, the liquid replenishing device further comprises a recovery pipeline for recovering the chemical liquids in the process unit to the liquid storage tank.

In the device mentioned above, the liquid replenishing device further comprises a liquid level sensor disposed at the side of the liquid storage tank to detect the chemical liquid level.

In the device mentioned above, the liquid storage tank comprises two parallel disposed liquid storage tanks.

According to the present invention, the liquid replenishing device can replenish liquids quantitatively and periodically in accordance with the change of the chemical liquid concentration caused by the repeated use of the chemical liquid, so as to maintain a stable concentration of the chemical liquid, therefore the process effect can be guaranteed, and the operation complexity can be reduced.

BRIEF DESCRIPTION OF THE DRAWINGS

The liquid replenishing device of the present invention will be elucidated by reference to the following embodiments and the accompanying drawings, in which:

The FIGURE is a schematic diagram of the liquid replenishing device according to an embodiment of the present invention.

DETAILED DESCRIPTION OF THE EMBODIMENTS

The liquid replenishing device of the presently preferred embodiments are discussed in further details hereinafter with respect the embodiments and the accompanying drawings. However, the embodiments described herein are not the only applications or uses contemplated for the invention. The specific embodiments discussed are merely illustrative of specific ways to make and use the invention, and do not limit the scope of the invention or the appended claims.

As shown in the FIGURE, the liquid replenishing device comprises two parallel disposed liquid storage tanks 1, 2, chemical liquid supply lines 3, 4, ultrapure water supply pipelines 5, 6, ultrapure water quantitative supplement pipelines 7, 8, and circulating pipelines 10, 11. The chemical liquid supply lines 3, 4 supply chemical liquid to the liquid storage tanks 1, 2, the ultrapure water supply pipelines 5, 6 supply ultrapure water to the liquid storage tanks 1, 2, and the ultrapure water quantitative supplement pipelines 7, 8 replenishes quantitative ultrapure water to the liquid storage tanks 1, 2. One end of each circulating pipelines 10, 11 is connected with the outlet of the liquid storage tanks 1, 2 and the other end is connected with the inlet.

Each of the chemical liquid supply pipelines 3, 4 is provided with a chemical liquid supply pneumatic valve 3', 4'. Each of the ultrapure water supply pipelines 5, 6 is provided with an ultrapure water supply pneumatic valve 5', 6'. Each of the ultrapure water quantitative supplement pipelines 7, 8 is provided with an ultrapure water replenishing pneumatic valve 7', 8', a main replenishing pneumatic valve 9' and a metering pump 10', 11'. In the embodiment, the main replenishing pneumatic valve 9' is used for controlling the injection of the ultrapure water into the ultrapure water quantitative supplement pipelines 7, 8. Each of the metering pumps 10', 11' is non-electrically controlled, the flow of which is determined according to the ultrapure water volume required to be replenished.

Each of the circulating pipelines 10, 11 is sequentially provided with a pneumatic valve 12', 13' for transferring the chemical liquid from the liquid storage tanks 1, 2 to the corresponding process unit, a liquid transfer pump 14', 15', a manual valve 16', 17' and a heating filter 18', 19'. The heating filter 18', 19' heats and filters the chemical liquids discharging from the liquid storage tanks 1, 2.

The liquid replenishing device also comprises recovery pipelines 12, 13 for recovering the chemical liquids in the process unit to the liquid storage tanks 1, 2, and liquid level sensors 20', 21' which are disposed at the sides of the liquid storage tanks 1, 2 to detect the chemical liquid level.

The working principles of the liquid replenishing device will be described in further details as follows.

As shown in the FIGURE, by taking the liquid storage tank 1 as an example, firstly the chemical liquid supply pneumatic valve 3' is turned on by a controller 14 to inject chemical liquids into the liquid storage tank 1. The injection volume of the chemical liquids is determined by controlling the turn-on time of the chemical liquid supply pneumatic valve 3' or by the feedback signal from the liquid level sensors 20' disposed at the side of the liquid storage tank 1. When the volume of the chemical liquids in the liquid storage tank 1 reaches a setting volume, the chemical liquid supply pneumatic valve 3' is turned off to stop supplying the chemical liquids. Then, the ultrapure water supply pneumatic valve 5' is turned on to inject ultrapure water (UPW) into the liquid storage tank 1. The injection volume of the ultrapure water is determined by controlling the turn-on time of the ultrapure water supply pneumatic valve 5'. When the ultrapure water has been injected to a setting volume, the ultrapure water supply pneumatic valve 5' is turned off to stop supply. After that, the manual valve 16', the pneumatic valve 12' and the liquid transfer pump 14' on the circulating pipeline 10 are turned on to transfer the liquids in the liquid storage tank 1 into the heating filter 18' for circulation heating. The temperature of the liquids is detected through the feedback signal from a temperature sensor in the heating filter, and the liquids are transported to the corresponding processing unit to perform certain processes when heated to the processing temperature. After the processes performed in the processing unit are completed, the chemical liquids will be recovered through the recovery pipeline 12 into the storage liquid tank 1 so as to be reused in other processes. With the recycling use of the chemical liquid, the liquid concentration will increase due to reasons like the evaporation of the ultrapure water. Therefore, in the embodiment, appropriate amounts of water are replenished to the chemical liquids in the liquid storage tank 1 at a regular time, wherein the required replenishment amount is constant. Before the water replenishment, the metering pump 10' is firstly calibrated as required, so that the volume of the pumped ultrapure water through each open and close movement of the pump diaphragm can meet the replenishment demand. To be specific, the metering pump 10' can be calibrated by adjusting the knob on the metering pump 10' which controls the opening degree of the diaphragm. The relationship between the pumped liquid volume and the corresponding rotation degree of the knob can be obtained through previous test data. In addition, it is also required to ensure that no bubbles exist in the ultrapure water quantitative supplement pipeline 7. If they exist, the main replenishing pneumatic valve 9', the ultrapure water replenishing pneumatic valve 7' and the metering pump 10' are all turned on at first to discharge the bubbles and then turned off in reverse sequence. Then the water replenishment is performed through the following sequential steps: turning on the main replenishing pneumatic valve 9' by the controller 14; opening the metering pump 10'; turning off the main replenishing pneumatic valve 9'; turning on the ultrapure water replenishing pneumatic valve 7' and inhaling the ultrapure water; closing the metering pump 10' and discharging the ultrapure water therefrom; turning off the ultrapure water replenishing pneumatic valve 7'. After the aforementioned steps are completed, the quantitative ultrapure water replenishment is achieved.

According to the present invention, the water replenishment amount will not change as long as the opening degree of the metering pump 10' staying the same even the water inlet pressure varies, therefore the replenishment accuracy is ensured and influence of the water pressure fluctuation or pipeline pressure fluctuation to the replenishment volume is reduced.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A liquid replenishing device, comprising:
a liquid storage tank;
a chemical liquid supply pipeline supplying chemical liquids to the liquid storage tank;
an ultrapure water supply pipeline supplying ultrapure water to the liquid storage tank;
an ultrapure water quantitative supplement pipeline quantitatively replenishing ultrapure water to the liquid storage tank; and
a circulating pipeline having one end connected with an outlet of the liquid storage tank and the other end connected with an inlet of the liquid storage tank;
wherein the ultrapure water quantitative supplement pipeline is provided with an ultrapure water replenishing pneumatic valve, a main replenishing pneumatic valve and a metering pump; the flow of the metering pump is determined by the required volume of the ultrapure water to be replenished.

2. The device according to claim 1, wherein the chemical liquid supply pipeline is provided with a chemical liquid supply pneumatic valve.

3. The device according to claim 1, wherein the ultrapure water supply pipeline is provided with an ultrapure water supply pneumatic valve.

4. The device according to claim 1, wherein the circulating pipeline is sequentially provided with a pneumatic valve for transferring the chemical liquid from the liquid storage tank to a corresponding process unit, a liquid transfer pump, a manual valve and a heating filter for heating and filtering the chemical liquid from the liquid storage tank.

5. The device according to claim 1, further comprising a recovery pipeline for recovering the chemical liquids in process unit to the liquid storage tank.

6. The device according to claim 1, further comprising a liquid level sensor disposed at a side of the liquid storage tank to detect the chemical liquid level.

7. The device according to claim 1, wherein the liquid storage tank comprises two parallel disposed liquid storage tanks.

\* \* \* \* \*